United States Patent
Zang et al.

(10) Patent No.: US 12,099,091 B2
(45) Date of Patent: Sep. 24, 2024

(54) COST-SAVING SCHEME FOR SCAN TESTING OF 3D STACK DIE

(71) Applicant: Advanced Micro Devices, Inc., Santa Clara, CA (US)

(72) Inventors: Songgan Zang, Shanghai (CN); Qi Shao, Shanghai (CN); Lifeng Zhang, Shanghai (CN); Ahmet Tokuz, Santa Clara, CA (US); Lu Lu, Beijing (CN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/866,342

(22) Filed: Jul. 15, 2022

(65) Prior Publication Data
US 2024/0019493 A1    Jan. 18, 2024

(51) Int. Cl.
*G01R 31/3185* (2006.01)
*G01R 31/28* (2006.01)

(52) U.S. Cl.
CPC .  *G01R 31/318583* (2013.01); *G01R 31/2834* (2013.01); *G01R 31/318513* (2013.01); *G01R 31/318572* (2013.01)

(58) Field of Classification Search
CPC ........ G01R 31/318583; G01R 31/2834; G01R 31/318572; G01R 31/318513
See application file for complete search history.

(56) References Cited

U.S. PATENT DOCUMENTS

| | | | | |
|---|---|---|---|---|
| 8,593,170 | B2 * | 11/2013 | Van der Plas ... | G01R 31/31855 326/16 |
| 8,698,140 | B2 * | 4/2014 | Ito .................. | G01R 31/318536 257/E21.531 |
| 8,778,734 | B2 | 7/2014 | Metsis | |
| 9,304,167 | B2 * | 4/2016 | Hwang .......... | G01R 31/318513 |
| 9,784,790 | B2 * | 10/2017 | Robertazzi ......... | G01R 31/2853 |
| 10,496,561 | B2 | 12/2019 | Roberts et al. | |

(Continued)

OTHER PUBLICATIONS

H. Date, T. Hosokawa and M. Muraoka, "A SoC test strategy based on a non-scan DFT method," Proceedings of the 11th Asian Test Symposium, 2002. (ATS '02)., Guam, USA, 2002, pp. 305-310, (Year: 2002).*

(Continued)

*Primary Examiner* — Cynthia Britt
(74) *Attorney, Agent, or Firm* — Kowert, Hood, Munyon, Rankin & Goetzel, P.C.; Rory D. Rankin (57) ABSTRACT

A system and method for efficiently routing scan data between two dies used in three-dimensional packaging are described. In various implementations, a computing system includes at least a first semiconductor die (or first die) and a second die connected to one another within a three-dimensional (3D) package. The first die and the second die have multiple non-scan input/output (I/O) data channels between them for data transfer. The non-scan I/O data channels are partitioned into groups. The first die receives a given scan input data bit for testing a device under test (DUT) on the second die. The first die selects a first group of non-scan I/O data channels, and sends, to the second die, a copy of the given scan input data bit on each non-scan I/O data channel of the first group. The second die uses a voter circuit to determine the value of the given scan input data bit.

20 Claims, 9 Drawing Sheets

(56) References Cited

U.S. PATENT DOCUMENTS

| | | |
|---|---|---|
| 10,992,938 B2 | 4/2021 | Saeedi et al. |
| 11,804,479 B2 | 10/2023 | Wuu et al. |
| 2012/0079442 A1* | 3/2012 | Akar .................. G06F 30/3308 |
| | | 716/112 |
| 2022/0082623 A1* | 3/2022 | Tokuz ............ G01R 31/318572 |

OTHER PUBLICATIONS

M. Banga, N. Rahagude and M. S. Hsiao, "Design-for-test methodology for non-scan at-speed testing," 2011 Design, Automation & Test in Europe, Grenoble, France, 2011, pp. 1-6, (Year: 2011).*

* cited by examiner

COST-SAVING SCHEME FOR SCAN TESTING OF 3D STACK DIE

BACKGROUND

Description of the Relevant Art

Progress has been made in three-dimensional integrated circuits (3D ICs) that include two or more layers of active electronic components integrated both vertically and horizontally into a single circuit. Components within these layers may communicate using on-chip signaling, whether vertical or horizontal. In packaging for three-dimensional (3D) circuits, multiple dies are typically included with a first semiconductor die (or die) serving as a host (or base) die. This type of packaging is referred to as a System in Package (SiP).

Through silicon vias (TSVs) are used as interconnects in an SiP between a base die that resides at one location within a stack of dies and one or more other dies in the stack. When horizontal on-chip signaling is used in a 3D IC, a host die has another die placed horizontally with respect to the host die, and chip communication uses TSVs within the host die and the other die with an interposer-based integration connection between these TSVs. In such systems, printed circuit board is located below the interposer.

After the multiple separate dies are placed in the SiP, scan testing is performed on the separate dies. Scan testing is a testing method used to detect manufacturing faults, such as unintentional short circuits and unintentional open circuits, in the fabricated circuits. Scan testing uses selection circuitry for shifting test data into the circuitry in the form of an input (test) vector to combinatorial logic implemented by the circuitry. Scan testing also uses selection circuitry for shifting out results of tests as an output vector generated by the combinatorial logic. However, accessing the scan input/output (I/O) data signals of dies other than the host die is not straightforward. Automated test equipment (ATE) is used to send scan input data to the SiP. To provide the scan input data from the ATE to the SiP, the scan input data traverses interconnect wires on a printed circuit board, a metal pad on the printed circuit board, possibly multiple metal layers of a redistribution layer (RDL), a bump (or micro bump) or solder ball, and the host die (or base die). To provide the scan input data from the ATE to a die other than the host die, the scan input data further traverses TSVs located between the host die and the other die.

Adding TSVs between the two dies, such as the host die and another die, for transferring scan I/O data on dedicated channels is non-trivial. These added TSVs would be added along with the TSVs used between the two dies for transferring non-scan I/O data on dedicated channels. Consequently, the area used for the TSVs increases which increases cost and puts restrictions on die floor planning. In some cases, the number of additional TSVs can reach hundreds and even thousands of additional TSVs for transferring scan I/O data between the two dies. Additionally, each TSV may have a corresponding "keep out" zone that defines an area within which design or other elements cannot be placed. Further, to improve yield, each scan I/O data signal (and non-scan I/O data signal) has a redundant TSV available for transferring I/O data when a primary TSV fails and repair has been performed. Further still, some designs are restricted on locations for the interconnects such as TSVs. For example, a memory die or a memory portion of a die includes multiple memory array banks which cannot be moved or perforated to allow room for the multiple TSVs, their redundant TSVs used to improve yield, and their corresponding keep out zones.

In view of the above, systems and methods for efficiently routing scan data between two dies used in three-dimensional packaging are desired.

While the invention is susceptible to various modifications and alternative forms, specific implementations are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention. Further, it will be appreciated that for simplicity and clarity of illustration, elements shown in the figures have not necessarily been drawn to scale. For example, the dimensions of some of the elements are exaggerated relative to other elements.

Systems and methods for efficient routing of scan data between two dies are contemplated. In various implementations, a computing system includes at least a first semiconductor die (or first die) and a second die connected to one another within a three-dimensional (3D) package for the computing system. The 3D package is also referred to as a System in Package (SiP). The first die is used as a host die or a base die in the SiP. In an implementation, the second die is stacked vertically on the first die. In other words, the second die is placed on a side of the first die away from the printed circuit board such as a motherboard. In this configuration, the first die and the second die use through silicon vias (TSVs) between them for transferring data. In this configuration, the non-scan input/output (I/O) data channels between the first die and the second die includes TSVs.

In another implementation, the second die is placed horizontally next to the first die on an interposer. In other words, the second die is placed next to the first die in a direction along the printed circuit board. In this configuration, the first die and the second die use respective TSVs within the dies connected to in-package horizontal, low-latency integrated interconnect between them for transferring data. In this configuration, the non-scan input/output (I/O) data channels between the first die and the second die includes TSVs within the first die, the in-package horizontal, low-latency integrated interconnect between the first die and the second die, and TSVs within the second die. In either of these two configurations of the SiP, each of the first die and the second die previously had scan testing performed prior to being placed in the SiP.

One or more of a variety of built-in self-test (BIST) techniques are performed on the non-scan input/output (I/O) data channels between the first die and the second die. To improve yield of the SiP, each of the non-scan I/O data channels includes at least one redundant non-scan I/O data channel. In case a particular non-scan I/O data channel is determined to fail during BIST, it is possible to perform a repair operation to initiate use of the redundant non-scan I/O data channel for data transfer in place of the failed non-scan I/O data channel. The non-scan I/O data channels are partitioned into groups of non-scan I/O data channels (or groups). The number of non-scan I/O data channels in each group, which is the group size, is based on design requirements. In some implementations, the group size is fixed such as a fixed number of 5 non-scan I/O data channels. For example, write address bits 0-4 of a 32-bit write address are assigned to a first group, write address bits 5-9 of this 32-bit write address are assigned to a second group, and so forth. In other implementations, one or more groups have a different group size than other groups. In various implementations, the group size for any group is a positive, odd valued integer greater than one. In other implementations, the number of groups may be even and in the event of a tie in a vote, some other condition may be used to break the tie or take some other action.

For each group, a number of non-scan I/O data channels in the given group that pass BIST is determined. If there is no group identified as having a number of non-scan I/O data channels that pass BIST being less than a number of non-scan I/O data channels that fail BIST, then scan testing of the SiP is begun without delay. However, if there is at least one group identified as having a number of non-scan I/O data channels that pass BIST being less than a number of non-scan I/O data channels that fail BIST, then scan testing of the SiP is delayed. During the delay, repair operations are performed to switch data transfer from failing non-scan I/O data channels to corresponding redundant non-scan I/O data channels. In some implementations, repair operations are performed only for identified groups. For example, a particular group of 5 non-scan I/O data channels that has two failed non-scan I/O data channels is not among the identified groups. Despite having two failed non-scan I/O data channels, a repair operation is not performed on this particular group prior to executing scan testing on the SiP. The repair operation can be performed after scan testing has completed on the SiP.

The scan testing includes testing a device under test (DUT) on the second die. An example of the DUT is a general-purpose central processing unit (CPU). Another example of the DUT is a processing unit with a highly parallel data microarchitecture with multiple parallel execution lanes such as a graphics processing unit (GPU), a digital signal processor (DSP), or other. Other examples of the DUT are a multimedia engine, a video or display controller, a memory unit such as a cache that includes data storage and a cache controller, an interface unit for communication with off-chip memory or a particular peripheral (I/O) device, and a variety of other components used in a system on a chip (SoC).

The first die includes hardware, such as circuitry of a control unit, that receives a given scan input data bit for testing the DUT on the second die. The control unit of the first die selects a first group of non-scan I/O data channels between the first die and the second die. The control unit sends, to the second die, a copy of the given scan input data bit on each non-scan I/O data channel of the first group. Therefore, the first die and the second die do not use dedicated scan I/O data channels between them to perform scan testing on the DUT. The second die includes hardware, such as circuitry of a control unit, that receives the multiple copies of the given scan input data bit transferred on the first group. The control unit of the second die includes a voter circuit that determines the value of the given scan input data bit based on the received multiple copies. The second die uses this value to perform scan testing on the DUT. When the circuitry of the DUT provides a corresponding given scan output data bit, the control unit of the second die performs similar steps as above to send multiple copies of the value of the given scan output data bit to the first die. However, a different group than the first group is used for this scan output data transfer. The control unit of the first die also includes a voter circuit. This voter circuit determines the value of the given scan output data bit based on the received multiple copies. The first die sends a copy of this given scan output data bit to a memory for data storage and later analysis.

Figure 1:
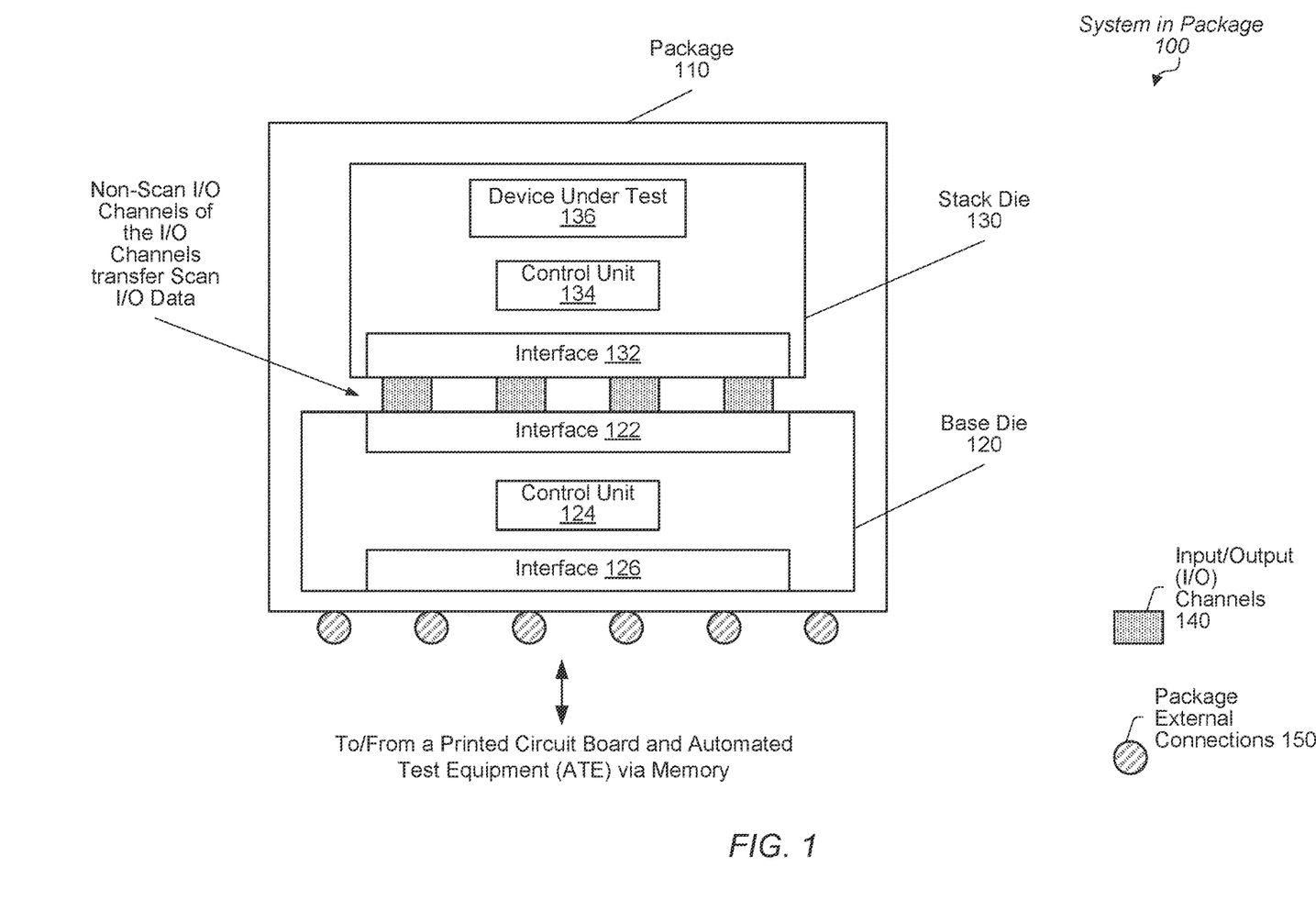
FIG. 1 is a generalized diagram of a system in package (SiP).

Turning now to FIG. 1, a generalized diagram is shown of a system-in-package (SiP) 100. In various implementations, three-dimensional (3D) packaging is used within a computing system to create the SiP 100. Die-stacking technology is a fabrication process that enables the physical stacking of multiple separate pieces of silicon (integrated chips) together in a same package with high-bandwidth and low-latency interconnects. In an implementation, the base semiconductor die 120 (or base die 120) and the stack semiconductor die 130 (or stack die 130) are included in package 110 of a System in Package (SiP), which utilizes three-dimensional (3D) integrated circuits (ICs). A 3D IC includes two or more layers of active electronic components integrated both vertically and/or horizontally into a single circuit. Here, vertical integration is shown.

As shown, in one implementation, the SiP 100 includes the stack die 130 stacked on top of the base die 120 (or host die 130). In other words, the stack die 130 is placed on a side of the base die 120 away from the printed circuit board (not shown), such as a motherboard, located below the package external connections 150. In this configuration, the base die 120 and the stack die 130 use through silicon vias (TSVs) between them as input/output (I/O) channels 140 for transferring data signals and control signals. In this configuration, the I/O channels 140 includes at least non-scan input/output (I/O) data channels between the base die 120 and the stack die 130, which utilize TSVs. The package 110 includes additional components not shown for ease of illustration such as one or more of an interposer, a package substrate, a redistribution layer (RDL), bonding pads, and so forth. Although two dies (120 and 130) are shown, any number of dies, any number of types of dies, and any order of vertical stacking is used in other implementations.

As described earlier, a printed circuit board (not shown) is located below the package 110 and communicates with the base die 120 through the package external connections 150. In various implementations, the package external connections 150 are one of a variety of surface mount device (SMD) pins that allow the package 110 to be placed directly onto the surface of the printed circuit board or placed directly on a redistribution layer (RDL), if a RDL is used, but the RDL is not included in the package 110. Examples of the SMD pins are solder ball grid arrays (BGAs), bumps or micro bumps, flat contacts or bonding pads, and so forth. It is contemplated that the base die 120 and the stack die 130 include one or more of a variety of processing units, a cache memory subsystem, data storage arrays, one or more of a variety of application specific integrated circuits (ASICs), a display controller, a communication interconnect or fabric, and so on. For example, one or more of the base die 120 and the stack die 130 is a system on a chip (SoC).

As the base die 120 and the stack die 130 are stacked vertically as in three dimensional (3D) integrated circuits (ICs), in some implementations, particular signals use signal routes implemented as vertical hops between the vertically stacked dies 120 and 130. Examples of these particular signals include multiple types of non-scan signals. Scan signals include scan input data signals, scan enable control signals, and scan output data signals. Examples of these particular signals that are non-scan signals and use signal routes implemented as vertical hops are commands, messages, address information, response data, write data, data snoop requests, and so on. In some implementations, these particular signals are inserted in a packet for routing on the vertical hops between the vertically stacked dies 120 and 130. The particular signals also include power connection signals such as one or more power supply lines for conveying power supply voltage levels and ground reference voltage levels. These power connection signals are also sent on signal routes implemented as vertical hops between the vertically stacked dies 120 and 130.

The active device layer of each of the vertically stacked base die 120 and stack die 130 have direct vertical interconnects tunneling, or otherwise traversing, through them such as the TSVs of the I/O channels 140. The active device layer is a layer of multiple semiconductor fabrication layers, and the active device layer defines where a silicon substrate is doped to create a p-type region or an n-type region. A metal gate layer is formed later over the active device layer to create the gate terminal of a p-type transistor or an n-type transistor. The I/O channels 140, which utilize TSVs, are used as a vertical electrical connection traversing through a silicon wafer. The I/O channels 140 are an alternative interconnect to wire-bond and flip chips. Although the I/O channels 140 appear to end at the edges of the dies 120 and 130, the I/O channels 140 actually continue within the dies 120 and 130.

Because a TSV causes stress to surrounding materials and circuitry, a keep out zone is often used for a TSV. Using such keep out zones creates an increased distance between the TSV and nearby devices which reduces the impact TSV induced stresses may have on nearby devices. The size and density of the TSVs and corresponding keep out zones of the I/O channels 140 between the different device layers varies based on the technology used to fabricate the 3D ICs. In some implementations, TSVs between the vertically stacked dies 120 and 130 do not tunnel entirely through the dies to transport signals between them and other dies. Rather, in some implementations, TSVs only traverse portions of a die. For example, one or more TSVs tunnels through a silicon substrate and oxide layers and end at a particular metal layer within the vertically stacked dies 120 and 130. The metal layers can be any of the metal layers from the lowest metal zero (M0) layer to the highest metal layer used by a particular die. In some implementations, a particular TSV reaches the upper metal layers and goes no farther. In some implementations, no active devices (transistors) are formed where this particular TSV of the I/O channels 140 is formed.

As shown, the base die 120 includes the interface 126 used to communicate with components located externally from the package 110 such as one or more of components on a printed circuit board, such as memory or other semiconductor chips, and an automated test equipment (ATE) via the memory or semiconductor chips on the printed circuit board. The base die 120 also includes the interface 122 used to communicate with the stack die 130 stacked vertically on the base die 120 in the package 110. Each of the interfaces 122 and 126 include one or more queues for storing requests and responses, and other hardware such as circuitry for creating packets, circuitry for determining how to schedule the issue of request and responses, circuitry for supporting one or more communication protocols, and so forth. The base die 120 also includes the control unit 124 that includes circuitry for controlling how non-scan I/O data channels of the I/O channels 140 are used to transfer scan I/O data between the base die 120 and the device under test (DUT) 136. The DUT 136 is representative of one of a variety of components located on the stack die 130. The DUT 136 can be any one of the components described earlier such as one of a variety of processing units, ASICs, other components of an SoC, and so forth.

In various implementations, the base die 120 receives, via the interface 126, a given scan input data bit from automated test equipment (ATE) for testing the DUT 136. Rather than send the given scan input data bit to the DUT 136 on a dedicated scan I/O channel, the base die 120 utilizes multiple of the preexisting non-scan I/O channels of the I/O channels 140 to send the given scan input data bit to the DUT 136. For example, the circuitry of the control unit 124 selects a first group of non-scan I/O channels of the I/O channels 140 used to transfer multiple non-scan input data bits for the DUT 136 when scan testing is not being performed. The control unit 124 sends, to the stack die 130, a copy of the received value of the given scan input data bit on each non-scan I/O channel of the selected first group. In one example, write address bits 0-4 of a 32-bit write address are assigned to a first group, write address bits 5-9 of this 32-bit write address are assigned to a second group, and so forth. In other implementations, one or more groups have a different group size than other groups. For example, not all groups have a group size of 5 bits. In various implementations, the group size for any group, though, is a positive, odd valued integer greater than one.

Using the above data transfer technique, the base die 120 and the stack die 130 do not use dedicated scan I/O data channels between them to perform scan testing on the DUT 136. The control unit 134 of the stack die 130 receives, via the interface 132, the multiple copies of the given scan input data bit transferred on the first group of multiple non-scan I/O channels of the I/O channels 140. The control unit 134 includes a voter circuit that determines the value of the given scan input data bit based on the received multiple copies. The control unit 134 sends this value determined by the voter circuit to the DUT 136 to perform scan testing on the DUT 136. By using preexisting non-scan I/O channels of the I/O channels 140 to send scan input data to the DUT 136, the package 110 does not increase area or cost associated with using dedicated scan I/O data channels among the I/O channels 140. It is noted that the package 110 uses one or more dedicated scan I/O control channels among the I/O channels 140 to indicate when scan testing is being performed. However, the number of dedicated scan I/O control channels is relatively small compared to the number of scan I/O data channels used for scan testing of the DUT 136.

When the circuitry of the DUT 136 provides a corresponding given scan output data bit, the control unit 134 performs similar steps as above to send multiple copies of the value of the given scan output data bit to the base die 120 via the interface 132, the I/O channels 140 and the interface 122. However, a different group than the first group is used for this transfer of the given scan output data bit. The control unit 124 also includes a voter circuit. This voter circuit determines the value of the given scan output data bit based on the received multiple copies. The base die 120 sends, via the interface 126 and the package external connections 150, a copy of this given scan output data bit to a memory for data storage and later analysis.

Figure 2:
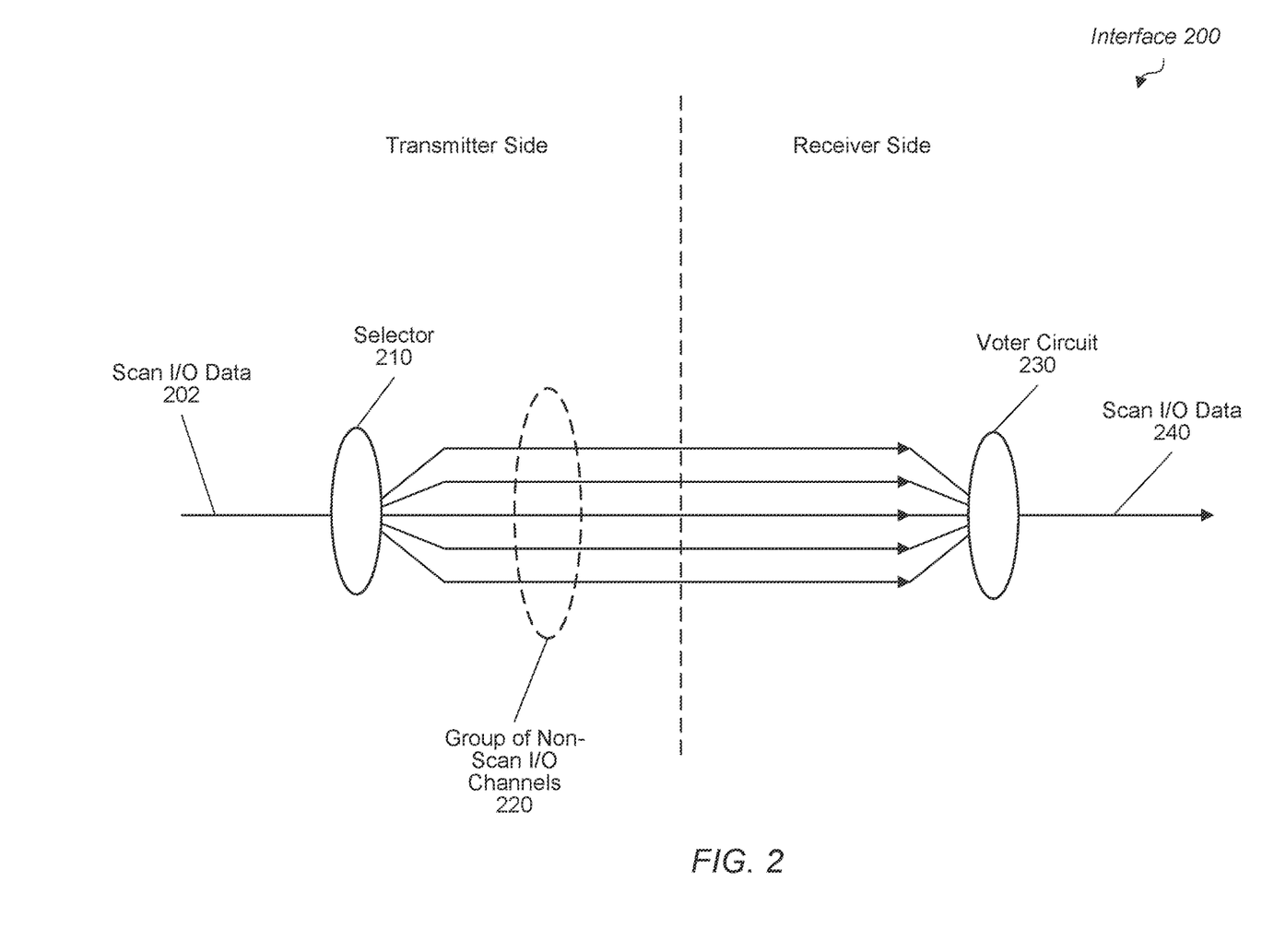
FIG. 2 is a generalized diagram of an interface used in a system in package (SiP).

Referring to FIG. 2, a generalized diagram is shown of an interface 200 used in a system in package (SiP). As shown, the interface 200 between a transmitter side and a receiver side includes a selector 210 that receives scan I/O data 202 and provides a copy of the scan I/O data 202 on each channel of the group of non-scan I/O channels 220. The voter circuit 230 receives the values of the multiple copies on the group of non-scan I/O channels 220, and provides the scan I/O data 240 to circuitry on the receiver side. The scan I/O data 240 has the same value as the value of the scan I/O data 202. For example, if the scan I/O data 202 has a value of a Boolean logic high value, then the voter circuit 230 provides the scan I/O data 240 to circuitry on the receiver side with a value of a Boolean logic high value.

As shown, the group of non-scan I/O channels 220 includes five channels that provide five bits to the voter circuit 230. The number of channels (or the number of bits) determines the group size of the group of non-scan I/O channels 220. Although a group size of five channels (or five bits) is shown, in other implementations, the group of non-scan I/O channels 220 has another group size. However, in various implementations, the group size of the group of non-scan I/O channels 220 is a positive, odd valued integer greater than one.

In one implementation, the voter circuit 230 provides a particular Boolean logic value on the scan I/O data 240 if and only if more than half of the received five channels of the group of non-scan I/O channels 220 have the same particular Boolean logic value. For example, if three or more of the five channels of the group of non-scan I/O channels 220 have a Boolean logic high value, then the voter circuit 230 provides a Boolean logic high value on the scan I/O data 240. Otherwise, if three or more of the five channels of the group of non-scan I/O channels 220 have a Boolean logic low value, then the voter circuit 230 provides a Boolean logic low value on the scan I/O data 240. Therefore, when the five channels of the group of non-scan I/O channels 220 have a same Boolean logic value, one or two of these five channels can fail with stuck-at faults or other, and the voter circuit 230 still provides the scan I/O data 240 with the same Boolean logic value. Based on a scan enable control signal, the selector 210 determines when to send five distinct non-scan I/O bits on these five channels, and when to send a same scan I/O bit on these five channels. Further details are provided below.

In an implementation, the transmitter side is a base die or host die, such as base die 120 of SiP 100 (of FIG. 1), when scan I/O data is scan input data, and this scan I/O data is being sent to a device under test (DUT) such as DUT 136 (of FIG. 1). In such a case, the receiver side is a stack die, such as stack die 130 of SiP 100 (of FIG. 1), when scan input data is being sent to from an ATE to a DUT. In another implementation, the transmitter side is a stack die, such as stack die 130 of SiP 100 (of FIG. 1), when scan output data is being sent from a DUT to an ATE. In such a case, the receiver side is a base die such as base die 120 of SiP 100 (of FIG. 1).

In an implementation, when the scan I/O data 202 is scan input data, the circuitry of the selector 210 is located in a control unit of a transmitter such as the control unit 124 of the base die 120 (of FIG. 1). The selector 210 provides a copy of the scan I/O data 202 on multiple I/O channels such as the group of non-scan I/O channels 220 (or "group 220"). In an implementation, the selector 210 includes multiple multiplexers that select the scan I/O data 202 to provide on the group 220 when scan testing is ongoing. For example, an asserted value of a scan enable control signal has been received by the transmitter side. The selection of the group 220 is based on at least a predetermined mapping between scan I/O data and groups of I/O channels. In one example, write address bits 0-4 of a 32-bit write address are assigned to a first group, such as group 220, write address bits 5-9 of this 32-bit write address are assigned to a second group, and so forth. In other implementations, one or more groups have a different group size than other groups. For example, not all groups have a group size of 5 bits. In various implementations, the group size for any group, though, is a positive, odd valued integer greater than one.

In some implementations, circuitry of a corresponding control unit accesses a table of mappings between particular scan I/O data and groups of I/O channels. In an implementation, this table access is also based on another input such as an indication of a particular clock cycle, a pipeline stage, or other. In an example, as described earlier, write address bits 0-4 of a 32-bit write address are assigned to the first group of I/O channels and a first scan input data. However, in another clock cycle or testing pipeline stage, the write address bits 0-4 of the 32-bit write address are assigned to a second scan input data different from the first scan input data. It is noted that, in an implementation, when the scan I/O data 202 is scan output data, the circuitry of the selector 210 is located in a control unit of a transmitter such as the control unit 134 of the stack die 130 (of FIG. 1).

Figure 3:
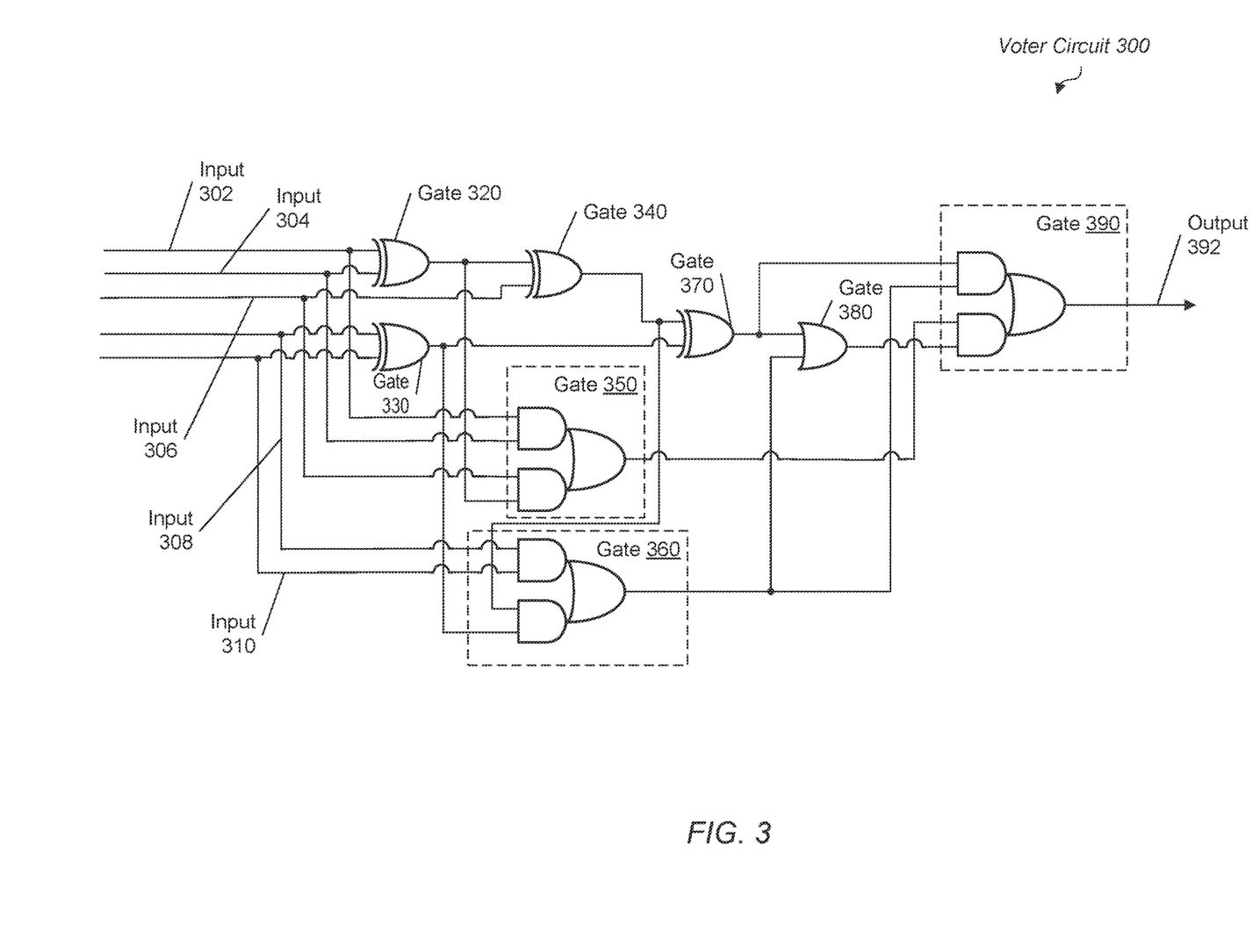
FIG. 3 is a generalized diagram of a voter circuit.

Turning now to FIG. 3, a generalized diagram is shown of a voter circuit 300. The voter circuit 300 is also referred to as a majority vote circuit. The voter circuit 300 receives a number of inputs that is a positive, odd valued integer greater than one. The voter circuit 300 determines which Boolean logic value (high or low) received on the input signals, such as the five input signals 302-310, outnumbers the other Boolean logic value (high or low). The voter circuit 300 provides a particular Boolean logic value on the output signal 392 (or output 392) if and only if more than half of the received five input signals 302-310 have the same particular Boolean logic value. For example, if three or more of the five input signals 302-310 have a Boolean logic high value, then the voter circuit 300 provides a Boolean logic high value on the output 392. Otherwise, if three or more of the five input signals 302-310 have a Boolean logic low value, then the voter circuit 300 provides a Boolean logic low value on the output 392. Therefore, when the five input signals 302-310 have a same Boolean logic value, one or two of the five input signals 302-310 can fail with stuck-at faults or other, and the voter circuit 300 still provides the output 392 with the same Boolean logic value.

As shown, in an implementation, the voter circuit 300 receives the input signals 302-310 and generates the output signal 392 using the Boolean logic gates 320-390. The Boolean logic gates (or gates) 320-390 use four exclusive-OR gates 320, 330, 340 and 370. Additionally, the voter circuit 300 uses complex Boolean AND-OR gates 350, 360 and 390. The voter circuit 300 also uses the Boolean OR gate 380. In other implementations, the voter circuit 300 receives another number of inputs other than five inputs that is a positive, odd valued integer greater than one. In an implementation, the voter circuit 300 allows circuitry of each of a base die and a stack die, such as the control units 124 and 134 (of FIG. 1), to use a majority voting scheme that supports scan testing on a SiP utilizing non-scan I/O channels despite one or more of the available non-scan I/O channels having failed BIST.

Figure 4:
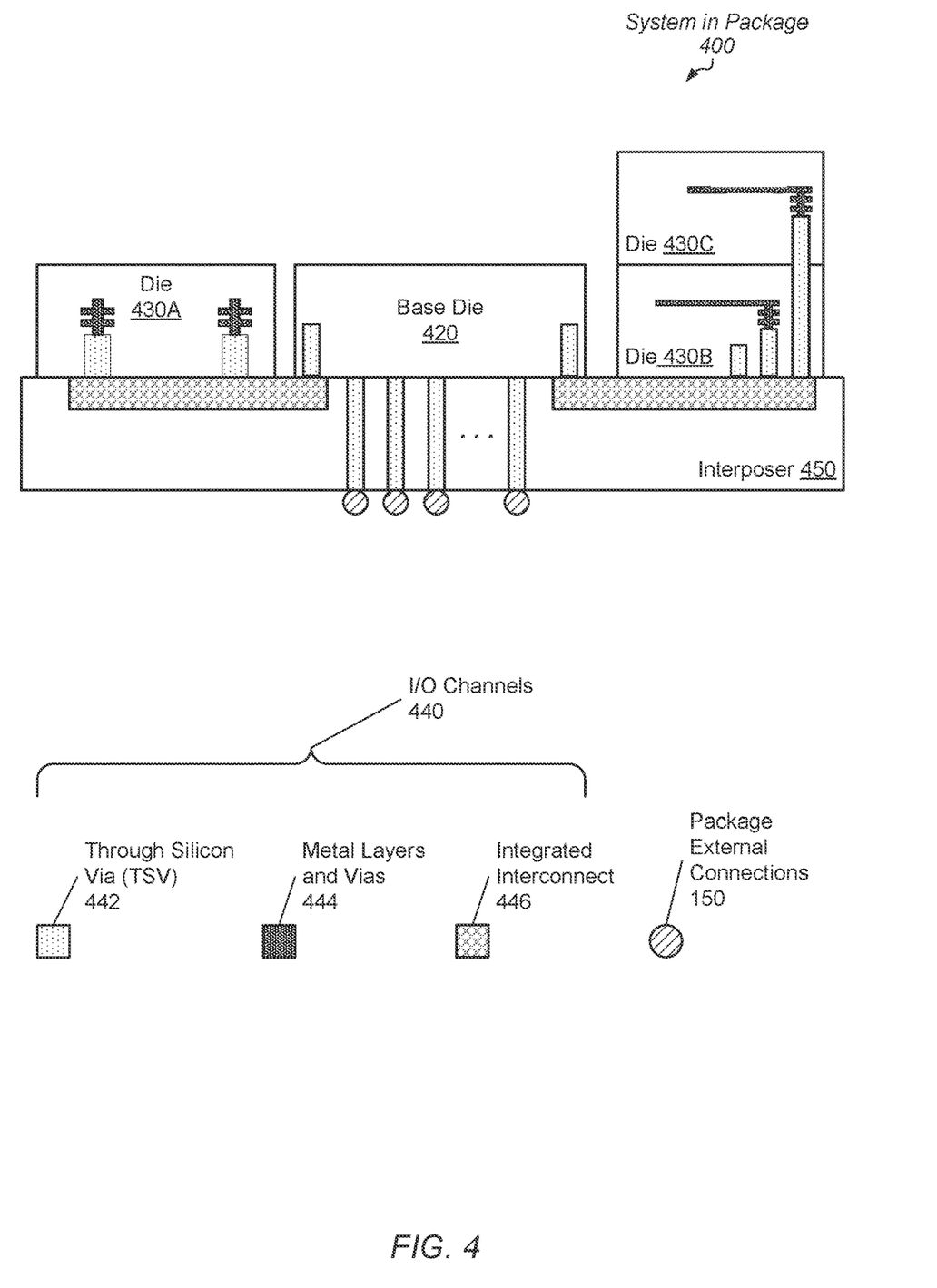
FIG. 4 is a generalized diagram of a system in package (SiP).

Turning now to FIG. 4, a generalized diagram is shown of a system-in-package (SiP) 400. Semiconductor fabrication materials, layers and components previously described are numbered identically. In contrast to the SiP 100, the SiP 300 also uses layers of active electronic components integrated horizontally into a single circuit, rather than integrated only vertically. To do so, the SiP 400 uses the in-package horizontal, low-latency integrated interconnect 446 (or interconnect 446), which provides reduced lengths of interconnect signals versus long off-chip interconnects. The interconnect 446 uses particular signals and protocols as if the chips, such as the base die 420 and dies 430A-430C were mounted in separate packages on a circuit board.

As described earlier, the TSVs 442 tunnel through a silicon substrate and oxide layers and ends at the metal layers and vias 444. The metal layers 444 can be any of the metal layers from the lowest metal zero (M0) layer to the highest metal layer used by a particular die. In some implementations, the TSVs 442 reach the upper metal layers and go no farther. Therefore, no active devices (e.g., transistors) are formed where the TSVs 442 are formed. Between the base die 420 and any one of the dies 430A-430C, for a particular I/O data signal or I/O control signal, the combination of the TSVs 442, the metal layers and vias 444 and integrated interconnect placed in the interposer 450 forms a particular I/O channel of the I/O channels 440.

In various implementations, the base die 420 and the dies 430A-430C include a control unit (not shown) that incorporates the functionality of the control units 124 and 134 of the SiP 100 (of FIG. 1). Therefore, the base die 420 and any one of the dies 430A-430C do not use dedicated scan I/O data channels between them to perform scan testing on a DUT located in one of the dies 430A-430C.

Figure 5:
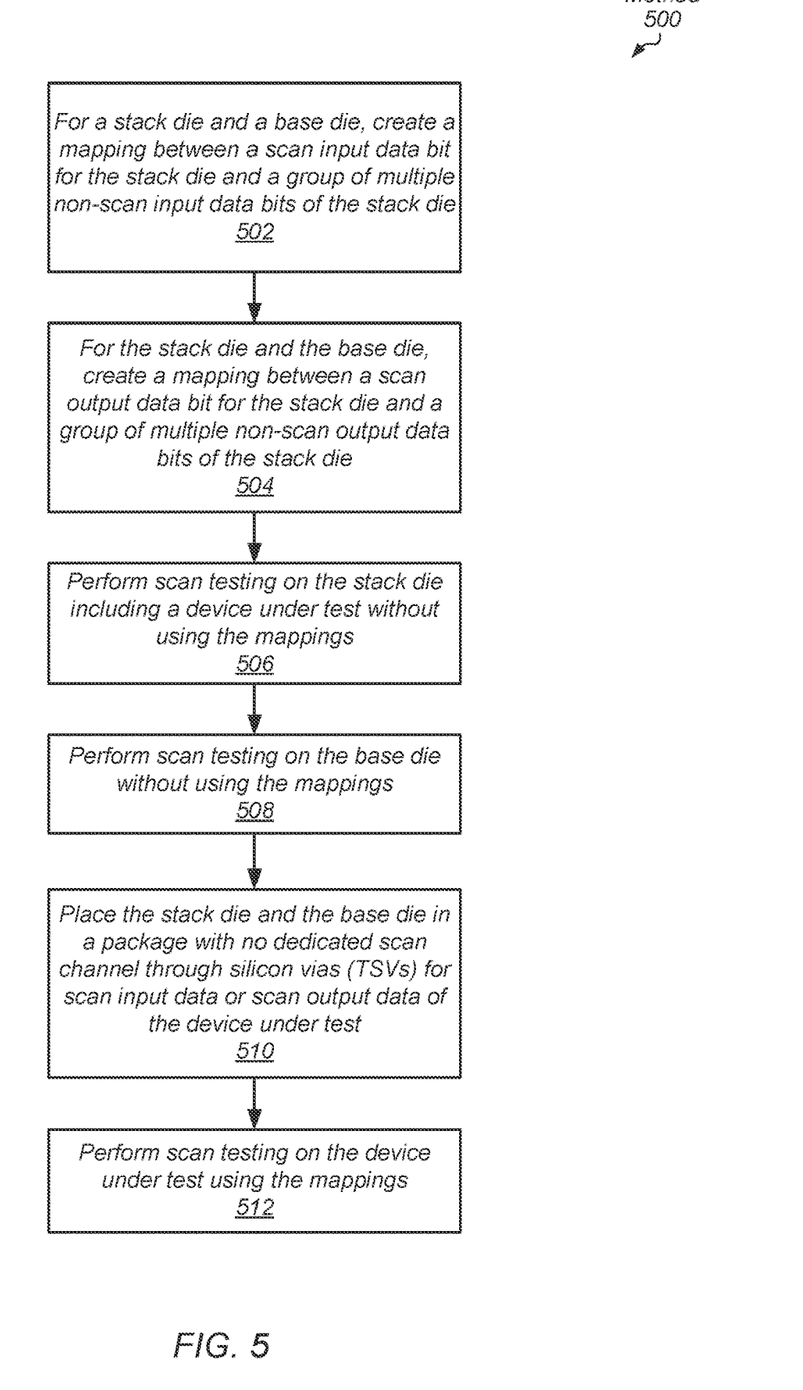
FIG. 5 is a generalized diagram of a method for efficiently routing scan data between two dies used in three-dimensional packaging.

Referring to FIG. 5, a generalized diagram is shown of a method 500 for efficiently routing scan data between two dies used in three-dimensional packaging. For purposes of discussion, the steps in this implementation (as well as in FIGS. 6-9) are shown in sequential order. However, in other implementations some steps occur in a different order than shown, some steps are performed concurrently, some steps are combined with other steps, and some steps are absent.

In an implementation, at least a base die and a stack die are included in a System in Package (SiP), which utilizes three-dimensional (3D) integrated circuits (ICs). A 3D IC includes two or more layers of active electronic components integrated both vertically and/or horizontally into a single circuit. For the stack die and the base die, one or more control units of these dies create a mapping between a scan input data bit for the stack die and a group of multiple non-scan input data bits of the stack die (block 502). For the stack die and the base die, one or more control units of these dies create a mapping between a scan output data bit for the stack die and a group of multiple non-scan output data bits of the stack die (block 504). Prior to being placed in a SiP, scan testing on the stack die including a device under test is performed without using the mappings (block 506). Prior to being placed in the SiP, scan testing on the base die is performed without using the mappings (block 508). During a semiconductor fabrication process, the stack die and the base die are placed in a package with no dedicated scan channel through silicon vias (TSVs) for scan input data or scan output data of the device under test (block 510). Scan testing is performed on the device under test using the mappings (block 512). During the scan testing, the base die and the stack die do not use dedicated scan I/O data channels between them to perform scan testing on the DUT.

Figure 6:
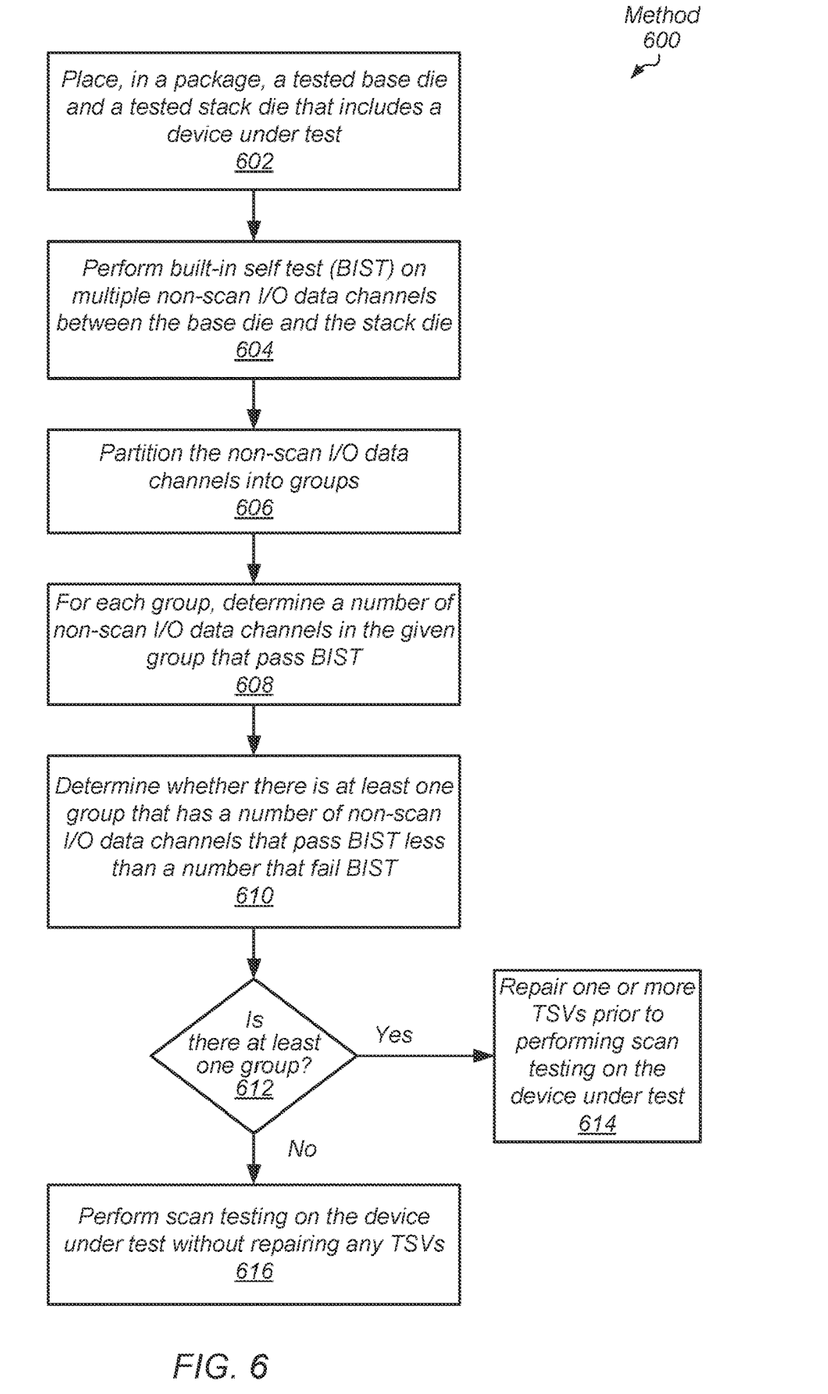
FIG. 6 is a generalized diagram of a method for efficiently routing scan data between two dies used in three-dimensional packaging.

Referring to FIG. 6, a generalized diagram is shown of a method 600 for efficiently routing scan data between two dies used in three-dimensional packaging. A tested base die and a tested stack die that includes a device under test are placed in a package that supports 3D ICs (block 602). Multiple non-scan I/O data channels between the base die and the stack die have built-in self-test (BIST) performed on them (block 604). The non-scan I/O data channels include at least TSVs. In some implementations, the non-scan I/O data channels also include metal layers, vias, and in-package horizontal, low-latency integrated interconnect. The non-scan I/O data channels are partitioned into groups of multiple non-scan I/O data channels (block 606).

For each group, a number of non-scan I/O data channels in the given group that pass BIST is determined (block 608). It is determined whether there is at least one group that has a number of non-scan I/O data channels that pass BIST less than a number that fail BIST (block 610). If there is at least one group ("yes" branch of the conditional block 612), then one or more non-scan I/O data channels are repaired prior to performing scan testing on the device under test (block 614). If there is no group ("no" branch of the conditional block 612), then scan testing begins on the device under test without repairing any non-scan I/O data channels (block 616).

Figure 7:
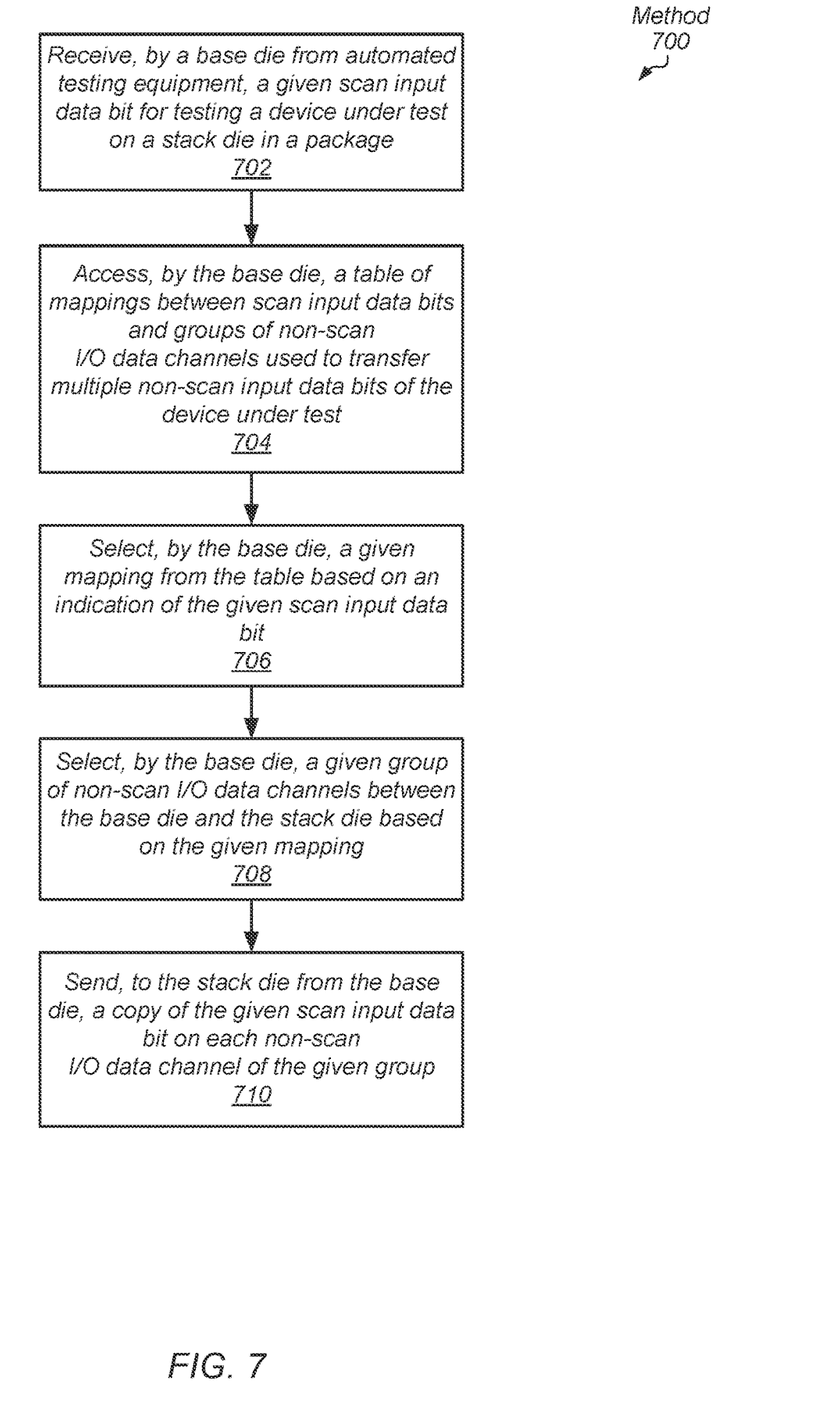
FIG. 7 is a generalized diagram of a method for efficiently routing scan data between two dies used in three-dimensional packaging.

Turning now to FIG. 7, a generalized diagram is shown of a method 700 for efficiently routing scan data between two dies used in three-dimensional packaging. A base die in a SiP receives, from automated test equipment, a given scan input data bit for testing a device under test on a stack die in the package of the SiP (block 702). The base die accesses a table of mappings between scan input data bits and groups of non-scan I/O data channels to transfer multiple non-scan input data bits of the device under test (block 704). The base die selects a given mapping from the table based on an indication of the given scan input data bit (block 706). The base die selects a given group of non-scan I/O data channels between the base die and the stack die based on the given mapping (block 708). The base die sends, to the stack die, a copy of the given scan input data bit on each non-scan I/O data channel of the given group (block 710). It is noted that the given group of non-scan I/O data channels includes at least TSVs. In some implementations, the given group of non-scan I/O data channels also include metal layers, vias, and in-package horizontal, low-latency integrated interconnect.

Figure 8:
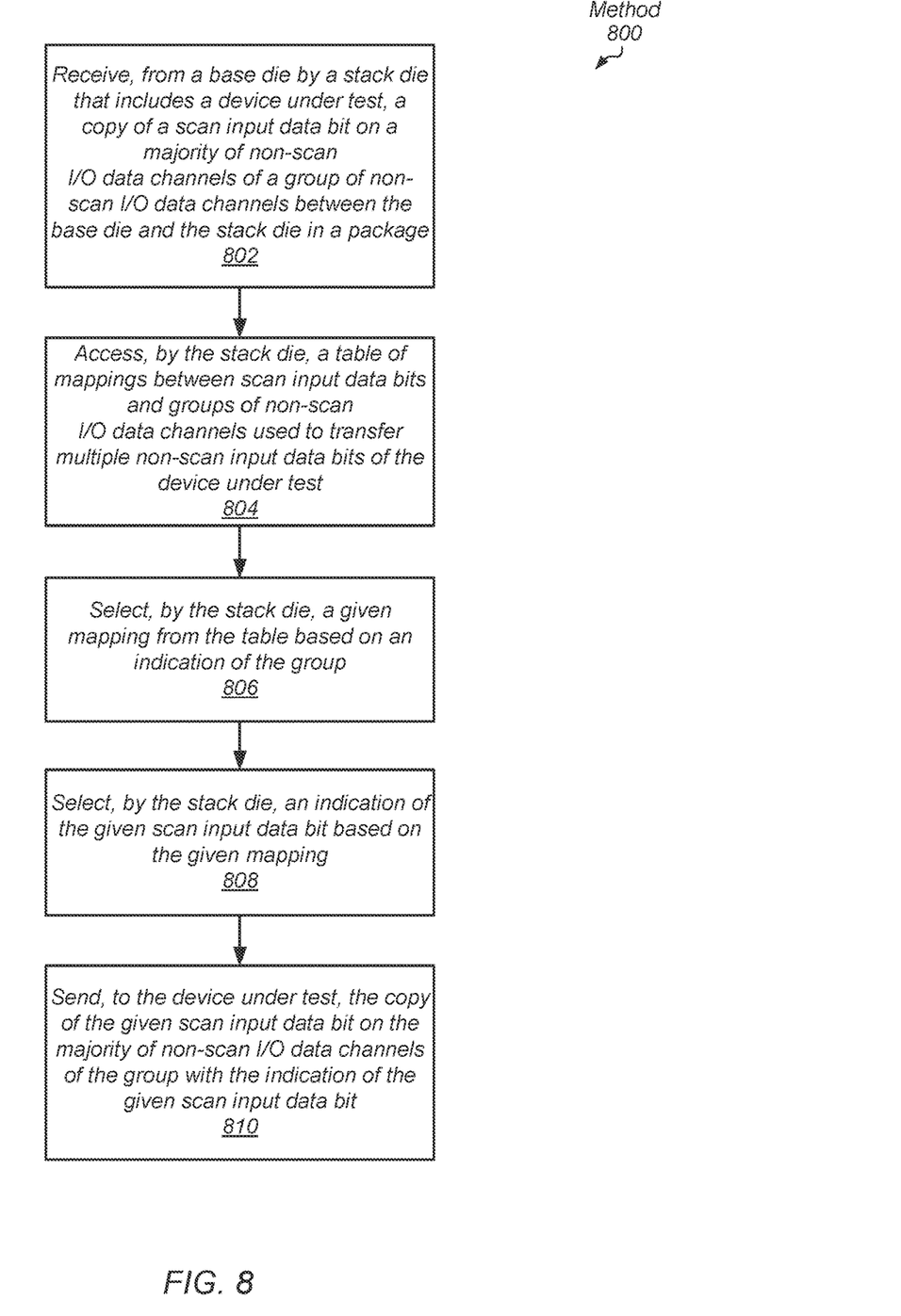
FIG. 8 is a generalized diagram of a method for efficiently routing scan data between two dies used in three-dimensional packaging.

Referring to FIG. 8, a generalized diagram is shown of a method 800 for efficiently routing scan data between two dies used in three-dimensional packaging. A stack die that includes a device under test receives, from a base die, a copy of a scan input data bit on a majority of non-scan I/O data channels of a group of non-scan I/O data channels between the base die and the stack die in a package such as a SiP (block 802). The stack die accesses a table of mappings between scan input data bits and groups of non-scan I/O data channels used to transfer multiple non-scan input data bits of the device under test (block 804). The stack die selects a given mapping from the table based on an indication of the group (block 806). The stack die selects an indication of the given scan input data bit based on the given mapping (block 808). The stack die sends, to the device under test, the copy of the value of the given scan input data bit on the majority of non-scan I/O data channels of the group with the indication of the given scan input data bit (block 810).

Figure 9:
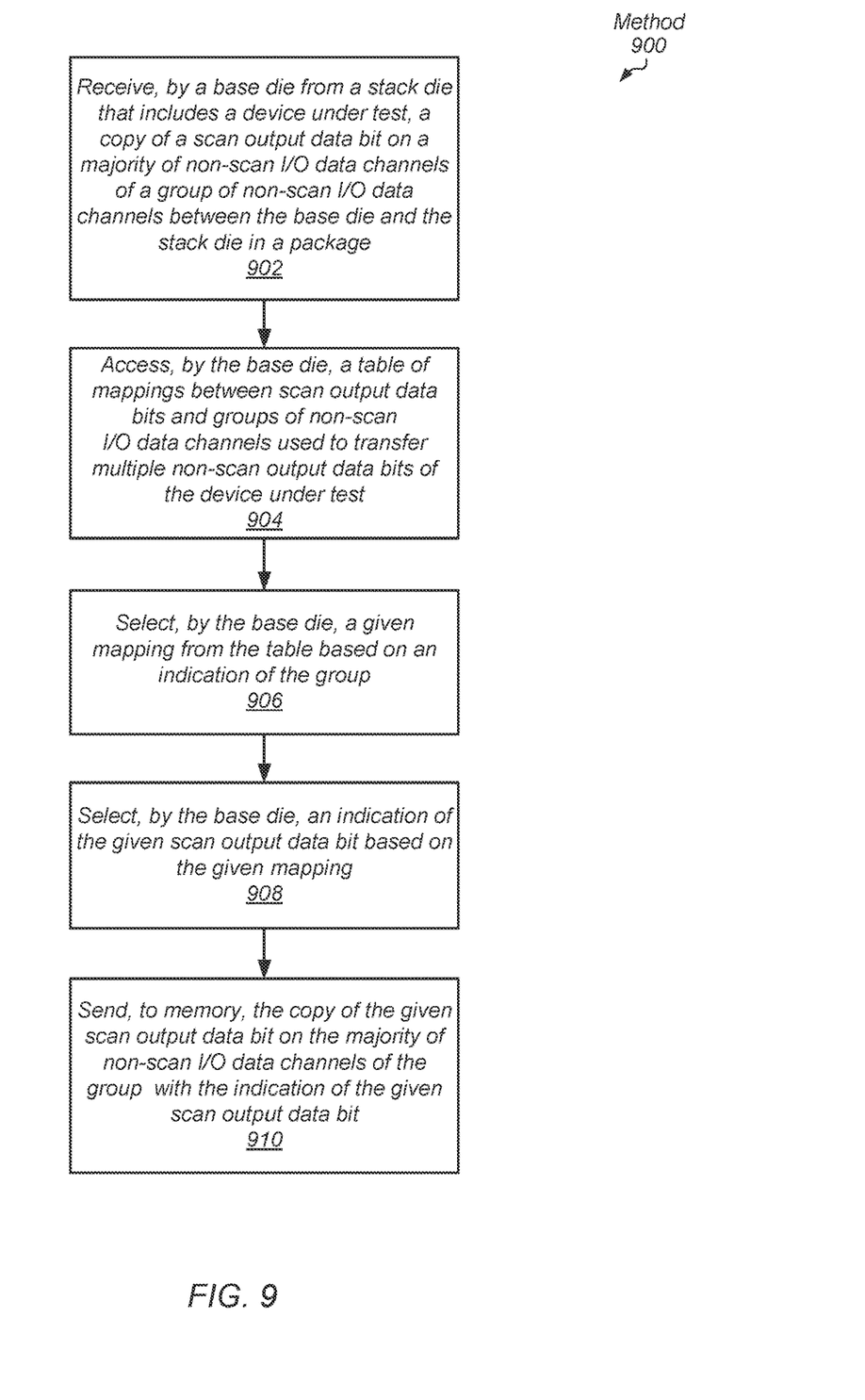
FIG. 9 is a generalized diagram of a method for efficiently routing scan data between two dies used in three-dimensional packaging.

Turning now to FIG. 9, a generalized diagram is shown of a method 900 for efficiently routing scan data between two dies used in three-dimensional packaging. A base die of a SiP receives, from a stack die that includes a device under test, a copy of a scan output data bit on a majority of non-scan I/O data channels of a group of non-scan I/O data channels between the base die and the stack die in a package (block 902). The base die accesses a table of mappings between scan output data bits and groups of non-scan I/O data channels used to transfer multiple non-scan output data bits of the device under test (block 904). The base die selects a given mapping from the table based on an indication of the group (block 906). The base die selects an indication of the given scan output data bit based on the given mapping (block 908). The base die sends, to memory, the copy of the given scan output data bit on the majority of non-scan I/O data channels of the group (block 910). At a later time, the copy of the given scan output data bit and other scan output information is analyzed to determine whether the device under test passed scan testing, and to determine which scan tests failed, if any.

It is noted that one or more of the above-described implementations include software. In such implementations, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer.

For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various implementations, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the implementations above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
circuitry configured to:
receive, via a first interface, a given scan input data bit from automated test equipment for testing a device under test on a semiconductor die;
and
send, to the semiconductor die via a second interface, a copy of the given scan input data bit on each non-scan I/O data channel of a first group of non-scan I/O data channels, responsive to the first group of non-scan I/O data channels being selected from a first plurality of non-scan I/O data channels used to transfer a plurality of non-scan input data bits for the device under test between an integrated circuit and the semiconductor die.

2. The integrated circuit as recited in claim 1, wherein the integrated circuit further comprises a table of mappings between scan input data bits for a device under test on the semiconductor die and groups of non-scan I/O data channels of the first plurality of non-scan I/O data channels, wherein the circuitry is further configured to access the table using an indication of the given scan input data bit.

3. The integrated circuit as recited in claim 2, wherein the circuitry is further configured to select a given mapping from the table based on the indication of the given scan input data bit.

4. The integrated circuit as recited in claim 3, wherein the circuitry is further configured to select the first group based on the given mapping.

5. The integrated circuit as recited in claim 1, wherein the circuitry is further configured to:
receive, from a device under test on the semiconductor die via the second interface, a copy of a given scan output data bit on a majority of non-scan I/O data channels of a second group of non-scan I/O data channels of a second plurality of TSVs between the integrated circuit and the semiconductor die used to transfer a plurality of non-scan output data bits of the device under test.

6. The integrated circuit as recited in claim 5, wherein the circuitry is further configured to:
determine an indication of the given scan output data bit based on an indication of the second group; and send, to a memory via the first interface, the copy of the given scan output data bit on the majority of non-scan I/O data channels of the second group with the indication of the given scan output data bit.

7. The integrated circuit as recited in claim 5, wherein the integrated circuit further comprises a voter circuit configured to:
receive, via the second interface, a plurality of scan output data bits on the second group; and
determine a value of the given scan output data bit on the majority of non-scan I/O data channels of the second group.

8. A method, comprising:
receiving, by a control unit of a first semiconductor die, a given scan input data bit for testing a device under test on a second semiconductor die;
and
sending, by the control unit to the second semiconductor die, a copy of the given scan input data bit on each non-scan I/O data channels of a first group of non-scan I/O data channels, responsive to the first group of non-scan I/O data channels being selected from a first plurality of non-scan I/O data channels used to transfer a plurality of non-scan input data bits for the device under test between an integrated circuit and the semiconductor die.

9. The method as recited in claim 8, further comprising accessing, by the control unit using an indication of the given scan input data bit, a table of mappings between scan input data bits for a device under test on the second semiconductor die and groups of non-scan I/O data channels of the first plurality of non-scan I/O data channels.

10. The method as recited in claim 9, further comprising selecting, by the control unit, a given mapping from the table based on the indication of the given scan input data bit.

11. The method as recited in claim 10, further comprising selecting, by the control unit, the first group based on the given mapping.

12. The method as recited in claim 8, further comprising:
receiving, by the control unit from a device under test on the second semiconductor die, a copy of a given scan output data bit on a majority of non-scan I/O data channels of a second group of non-scan I/O data channels of a second plurality of non-scan I/O data channels between the first semiconductor die and the second semiconductor die used to transfer a plurality of non-scan output data bits of the device under test.

13. The method as recited in claim 12, further comprising:
determining, by the control unit, an indication of the given scan output data bit based on an indication of the second group; and
sending, by the control unit to a memory, the copy of the given scan output data bit on the majority of TSVs of the second group with the indication of the given scan output data bit.

14. The method as recited in claim 12, further comprising:
receiving, by a voter circuit of the control unit, a plurality of scan output data bits on the second group; and
determining, by the voter circuit, a value of the given scan output data bit on the majority of non-scan I/O data channels of the second group.

15. A system in package, comprising:
a first semiconductor die; and
a second semiconductor die placed in a system in a package (SiP with the first semiconductor die;
wherein the first semiconductor die includes:
a control unit comprising circuitry configured to:
receive a given scan input data bit for testing a device under test on the second semiconductor die;
and
send, to the second semiconductor die, a copy of the given scan input data bit on each non-scan I/O data channel of a first group of non-scan I/O data channels, responsive to the first group of non-scan I/O data channels being selected from a first plurality of non-scan I/O data channels used to transfer a plurality of non-scan input data bits for the device under test between an integrated circuit and the semiconductor die.

16. The system in package as recited in claim 15, wherein the control unit is further configured to access, using an indication of the given scan input data bit, a table of mappings between scan input data bits for a device under test on the second semiconductor die and groups of non-scan I/O data channels of the first plurality of non-scan I/O data channels.

17. The system in package as recited in claim 16, wherein the control unit is further configured to select a given mapping from the table based on the indication of the given scan input data bit.

18. The system in package as recited in claim 17, wherein the control unit is further configured to select the first group based on the given mapping.

19. The system in package as recited in claim 15, wherein the control unit is further configured to:
receive, from a device under test on the second semiconductor die, a copy of a given scan output data bit on a majority of non-scan I/O data channels of a second group of non-scan I/O data channels of a second plurality of non-scan I/O data channels between the first semiconductor die and the second semiconductor die used to transfer a plurality of non-scan output data bits of the device under test.

20. The system in package as recited in claim 19, wherein the control unit is further configured to:
determine an indication of the given scan output data bit based on an indication of the second group of TSVs; and
send, to a memory, the copy of the given scan output data bit on the majority of non-scan I/O data channels of the second group with the indication of the given scan output data bit.

* * * * *